United States Patent
Blessing et al.

(10) Patent No.: US 7,199,588 B2
(45) Date of Patent: Apr. 3, 2007

(54) METHOD AND SYSTEM FOR DETERMINING THE BUFFER ACTION OF A BATTERY

(75) Inventors: Alf Blessing, Heiningen (DE); Horst Brinkmeyer, Waiblingen (DE); Udo Fried, Waiblingen-Neustadt (DE); Rainer Maeckel, Koenigswinter (DE); Wilfried Miller, Stuttgart (DE); Manfred Stege, Langen in Hessen (DE)

(73) Assignee: DaimlerChrysler AG, Stuttgart (DE)

( * ) Notice: Subject to any disclaimer, the term of this patent is extended or adjusted under 35 U.S.C. 154(b) by 284 days.

(21) Appl. No.: 10/471,023

(22) PCT Filed: Feb. 26, 2002

(86) PCT No.: PCT/EP02/02032
§ 371 (c)(1),
(2), (4) Date: Feb. 27, 2004

(87) PCT Pub. No.: WO02/071087
PCT Pub. Date: Sep. 12, 2002

(65) Prior Publication Data
US 2004/0135581 A1     Jul. 15, 2004

(30) Foreign Application Priority Data
Mar. 8, 2001   (DE) ................... 101 11 408

(51) Int. Cl.
*G01N 27/416*   (2006.01)
(52) U.S. Cl. ............................................ 324/427
(58) Field of Classification Search .............. 320/132, 320/134, 136; 324/426–434; 702/63
See application file for complete search history.

(56) References Cited

U.S. PATENT DOCUMENTS 5,548,202 A * 8/1996 Schramm et al. ............. 322/33

(Continued)

FOREIGN PATENT DOCUMENTS

DE       3901680          3/1990

(Continued)

OTHER PUBLICATIONS

Konya et al., "A Deterioration Estimating System for 200 Ah Sealed Lead Acid Batteries", Proceedings of the International Telecommunications Conference (INTELC), 1994, vol. CONF 16, pp. 256-262.*

(Continued)

*Primary Examiner*—Pia Tibbits
(74) *Attorney, Agent, or Firm*—Crowell & Moring LLP

(57) ABSTRACT

A method for determining the buffering effect of the battery (2) for providing a voltage (U) for a power supply system (4), in particular for a vehicle, is provided in order to identify serviceability of a battery as easily and reliably as possible, in which method any voltage change and any current change are detected cyclically, the dynamic internal resistance of the battery is determined on the basis of the quotient of the voltage change and the current change, the specific dynamic internal resistance is monitored for exceeding an extreme value which can be predetermined, and a statement of the buffering effect of the battery is made and is output. In this case, the buffering effect of the battery is better, the smaller the quotient of the voltage change and current change.

11 Claims, 12 Drawing Sheets

U.S. PATENT DOCUMENTS

| | | | |
|---|---|---|---|
| 5,598,088 A * | 1/1997 | Richter | 320/134 |
| 5,661,393 A * | 8/1997 | Sengupta | 320/146 |
| 5,761,072 A | 6/1998 | Bardsley, Jr. et al. | 702/63 |
| 6,285,163 B1 * | 9/2001 | Watanabe et al. | 320/132 |
| 6,477,024 B1 * | 11/2002 | Kikuchi et al. | 361/79 |
| 6,479,967 B2 * | 11/2002 | Berlureau | 320/136 |
| 6,928,371 B1 * | 8/2005 | Roshau | 702/63 |
| 2006/0055373 A1 * | 3/2006 | Bopp et al. | 320/132 |

FOREIGN PATENT DOCUMENTS

| | | |
|---|---|---|
| DE | 19610927 | 9/1997 |
| DE | 19944517 | 5/2000 |
| EP | 0736951 | 10/1996 |
| EP | 1037063 A | 9/2000 |
| EP | 1081499 A | 3/2001 |
| JP | 3249582 | 11/1991 |
| WO | WO9009598 | 8/1990 |

OTHER PUBLICATIONS

Graf R. F., "Modern Dictionary of Electronics", 7th edition, 1999, pp. 285, 631.*

* cited by examiner

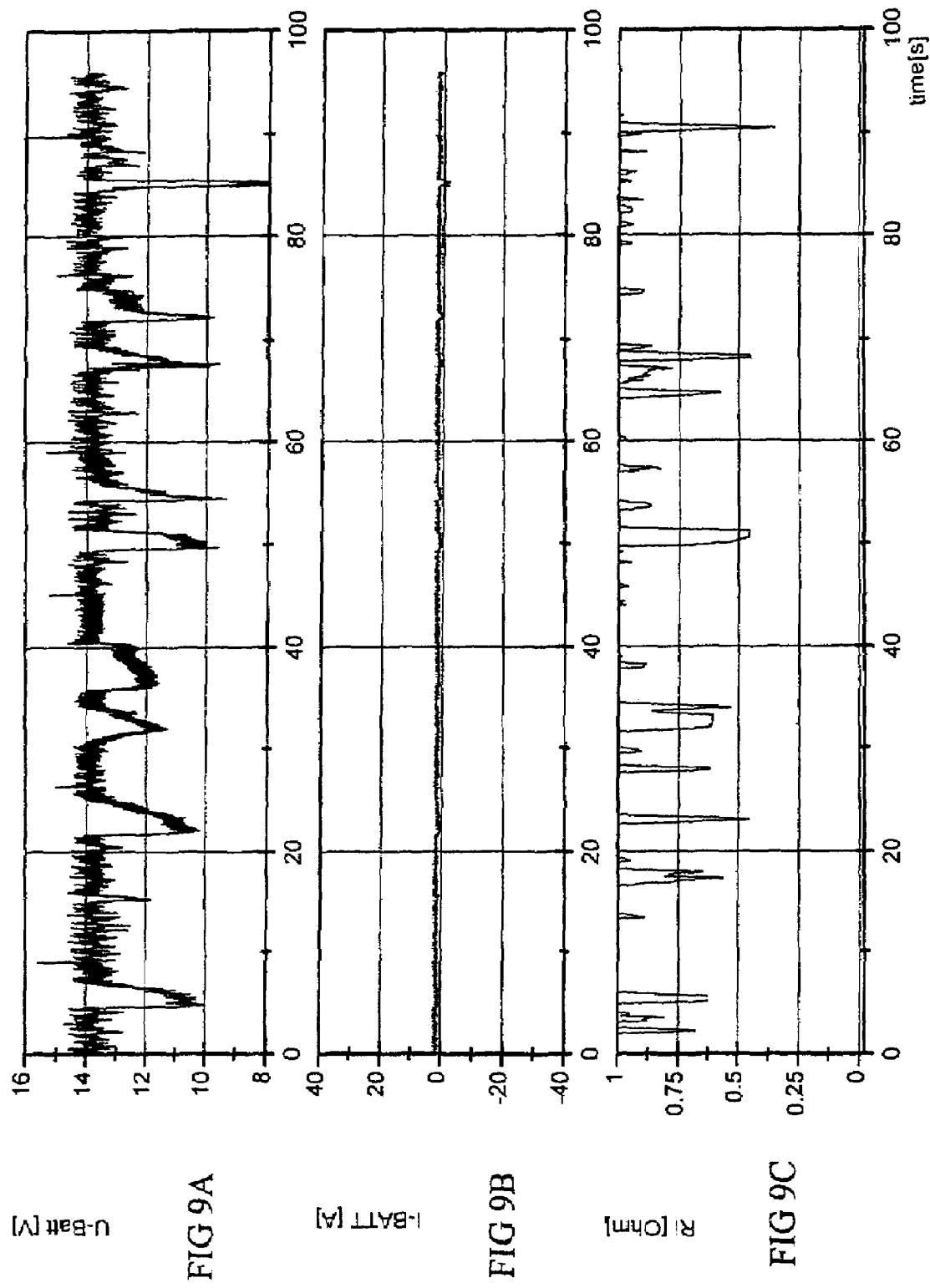

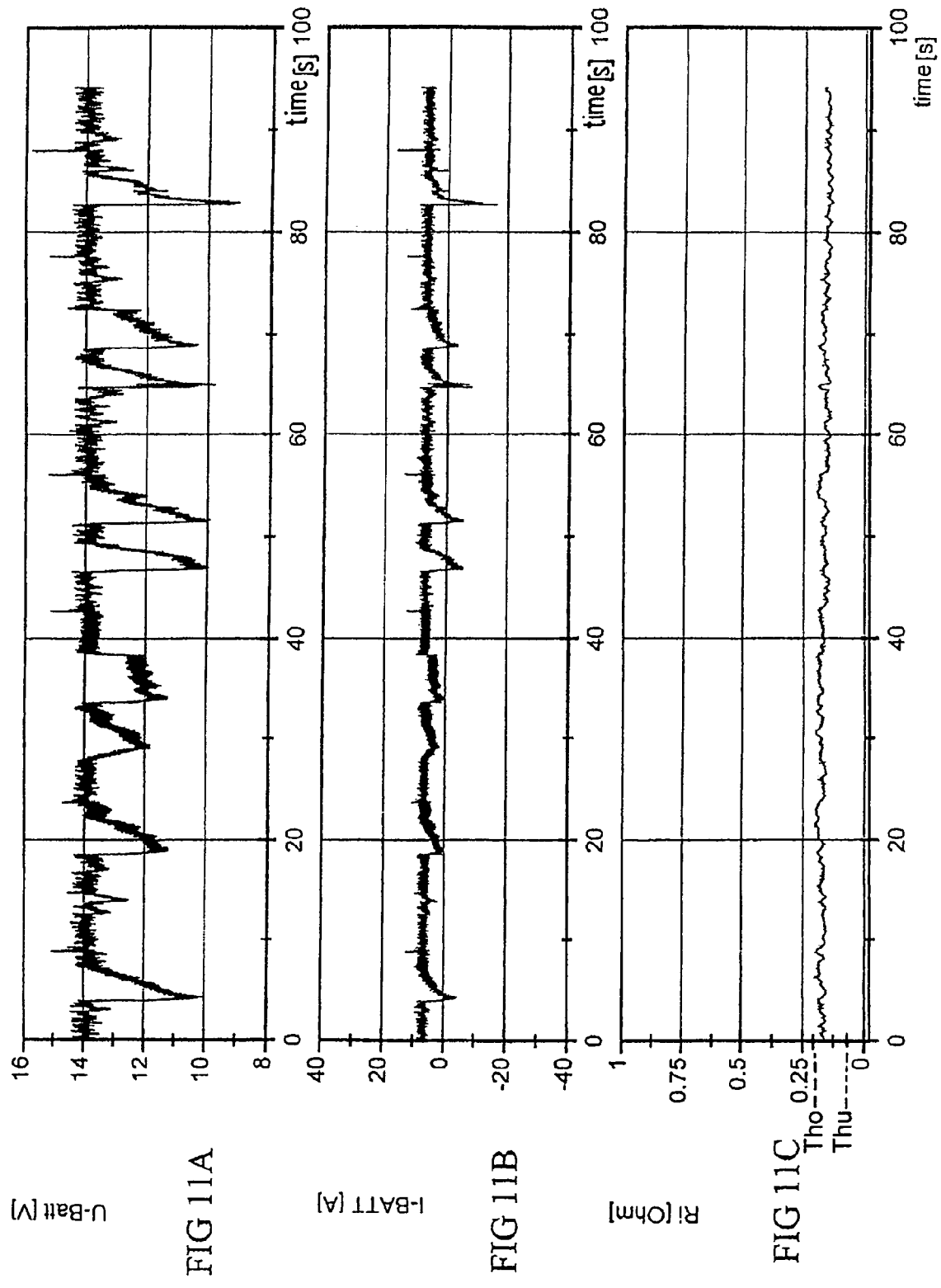

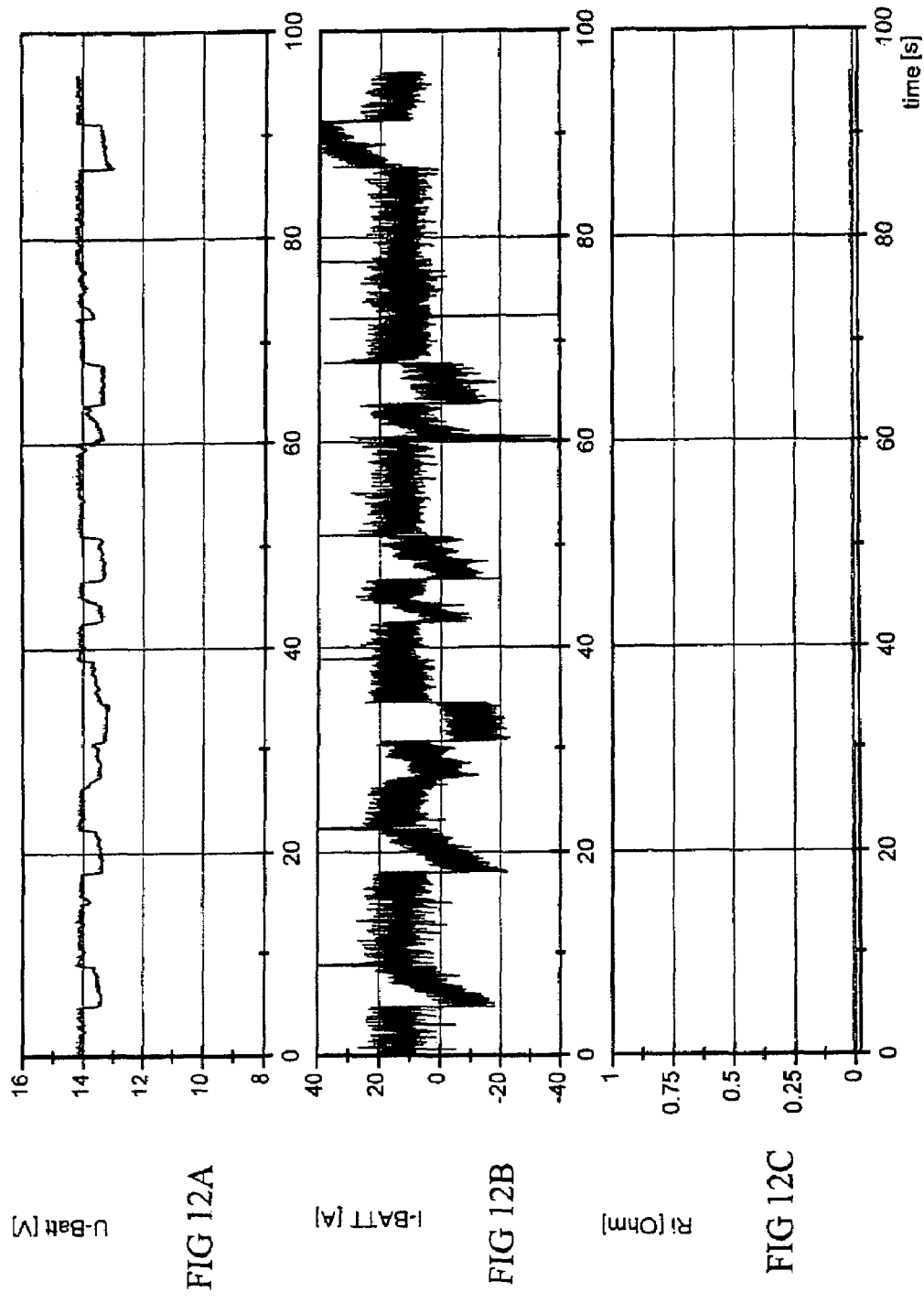

METHOD AND SYSTEM FOR DETERMINING THE BUFFER ACTION OF A BATTERY

CROSS REFERENCE TO RELATED APPLICATIONS

This application claims the benefit of the filing date of PCT Application No. PCT/EP02/02032, filed on Feb. 26, 2002, which in turn claims the benefit of the filing date of German Patent Application No. DE 10111408.7 filed on Mar. 8, 2001.

FIELD OF THE INVENTION

The invention relates to a method for determining the buffering effect of a battery for providing a voltage, in particular for a vehicle. The invention also relates to an arrangement for determining the buffering affect.

BACKGROUND OF THE INVENTION

Safety-relevant functions, such as electrical brakes, are being increasingly operated electrically in vehicles. In order to ensure that the serviceability of such safety-relevant components is guaranteed, they must be supplied with electrical power all the time. In order to achieve this, it is known for two energy sources to be provided in a vehicle, namely a battery and a generator.

Since the life of a conventional lead-acid battery is generally shorter than the life of a vehicle, it is possible for only one of the two energy sources to still be serviceable. This situation, in which a battery is discharged or defective and is thus unserviceable can result in damage to the battery or overloading of the second energy source, the generator. This can lead to the supply to the loads no longer being ensured. Furthermore, the vehicle may change to a safety-critical state. For this reasons, measurements of the battery's buffering effect are required which on the one hand warn the driver and on the other hand also keep the vehicle power supply system, and hence the vehicle, in an operationally safe state to ensure that loads which are relevant for operation and in particular those which are relevant to safety, such as engine electronics, electrical brakes, are not switched off. In addition to ensuring that as little current as possible is drawn, a minimum voltage level must be maintained in order to guarantee the operability of safety-relevant devices such as these. This can normally be ensured by means of the generator. However, if the battery has been deep-discharged or is defective in some other way, then it can no longer provide a buffering effect. This may possibly lead to the generator being de-energized by a load change during operation and the vehicle power supply system voltage suddenly collapsing, so that it is no longer possible to ensure that the safety relevant devices are operated.

In addition to ensuring that as little current as possible is drawn, a minimum voltage level must be maintained in order to guarantee the operability of safety-relevant devices such as these. This can normally be ensured by means of the generator. However, if the battery has been deep-discharged or is defective in some other way, then it can no longer provide a buffering effect. This may possibly lead to the generator being de-energized by a load change during operation and the vehicle power supply system voltage suddenly collapsing, so that it is no longer possible to ensure that the safety relevant devices are operated.

A method for determining the buffering effect of a battery for providing a voltage for a power supply system for a vehicle is known from DE 199 44 517 A1. In this case, the voltage ripple is detected and determined, and the maintenance of a limit value which can be predetermined is monitored using a monitoring unit.

Furthermore, a method for testing the quality of a battery is known from Japanese Laid-Open Specification JP 03-249 582 A. In this case, a constant AC source is used as a load for the battery to be tested, and the voltage level which then occurs is determined. The quality of the battery is then assessed on the basis of the resultant voltage levels. However, owing to the use of the constant AC source, an arrangement such as this cannot be used in a vehicle. Furthermore, the use of the constant AC source represents an extra signal being fed in, and this is complex.

The invention is thus based on the object of specifying a method for determining the buffering effect of a battery, which allows the serviceability of a battery to be identified as easily and reliably as possible. A further aim is to specify a particularly simple arrangement for determining the buffering effect of the battery.

SUMMARY OF THE INVENTION

An aspect of the invention relates to a method to determine a buffering effect of a battery. The method comprises cyclically determining a voltage change and a current change generated by the battery; determining a dynamic internal resistance of the battery based on a quotient of the voltage change and the current change; determining whether the dynamic internal resistance exceeds a predetermined value; and performing a predetermined operation if the dynamic internal resistance exceeds the predetermined value.

Another aspect of the invention relates to an apparatus to determine a buffering effect of a battery. The apparatus comprises a first sensor to generate a first signal related to a voltage generated by the battery; a second sensor to generate a second signal related to a current generated by the battery; a monitoring unit to generate a third signal related to a dynamic internal resistance of the battery using the first and second signals, and to cause a predetermined operation if the third signal exceeds a predetermined threshold.

The invention is in this case based on the idea that, when the battery has a negligible buffering effect, this leads to a change in the filter characteristics of the battery for the vehicle power supply system. According to the invention, the dynamic internal resistance of the battery is determined for this purpose, on the basis of the quotient of any voltage change and any current change. The dynamic internal resistance is preferably monitored for a minimum value which can be predetermined (i.e., a first predetermined threshold). This makes it possible to make a statement about the buffering effect of the battery by monitoring the dynamic internal resistance for exceeding a minimum value. The smaller the quotient of the voltage change and the current change, the better is the buffering effect of the battery. The dynamic internal resistance is in this case preferably determined when a significant current or voltage change occurs, for example when a change of more than 1 V or 5 A occurs.

In order to make a statement about the buffering effect of the battery even when small current and voltage changes occur, the internal resistance is preferably weighted by means of a weighting factor. In particular, this results in continuous monitoring of the dynamic internal resistance, and hence the continuous identification of the buffering effect. By way of example, the power is used as a weighting factor, based on the following expression $P=\Delta U \times \Delta I$. Depending on the nature and the embodiment, the weighting factor can be taken into account as a linear function or square function when determining the dynamic internal resistance.

A warning message is advantageously output when the limit value, that is to say the minimum value, is exceeded. This ensures that a warning message is output to the driver, for example in the form of an indicator light on the dashboard, when the buffering effect of the battery is no longer sufficient for emergency or safety operation or for short-term severe overloading.

For this purpose, the apparatus according to the invention has, inter alia, a monitoring unit for determining the dynamic internal resistance of the battery on the basis of the quotient of any voltage change and any current change.

This and further objects, features and advantages of the present invention will become clear from the following detailed description of preferred exemplary embodiments of the invention in conjunction with the drawing.

BRIEF DESCRIPTION OF THE DRAWINGS

Exemplary embodiments of the invention will be explained in more detail with reference to a drawing, in which:

FIGS. 5A–5B to 8A–8B and 9A–9C to 12A–12C show diagrams with functional profiles of the voltage and current for various exemplary embodiments.

Parts which correspond to one another are provided with the same reference symbols in all the figures.

DETAILED DESCRIPTION OF THE DRAWINGS

Figure 1:
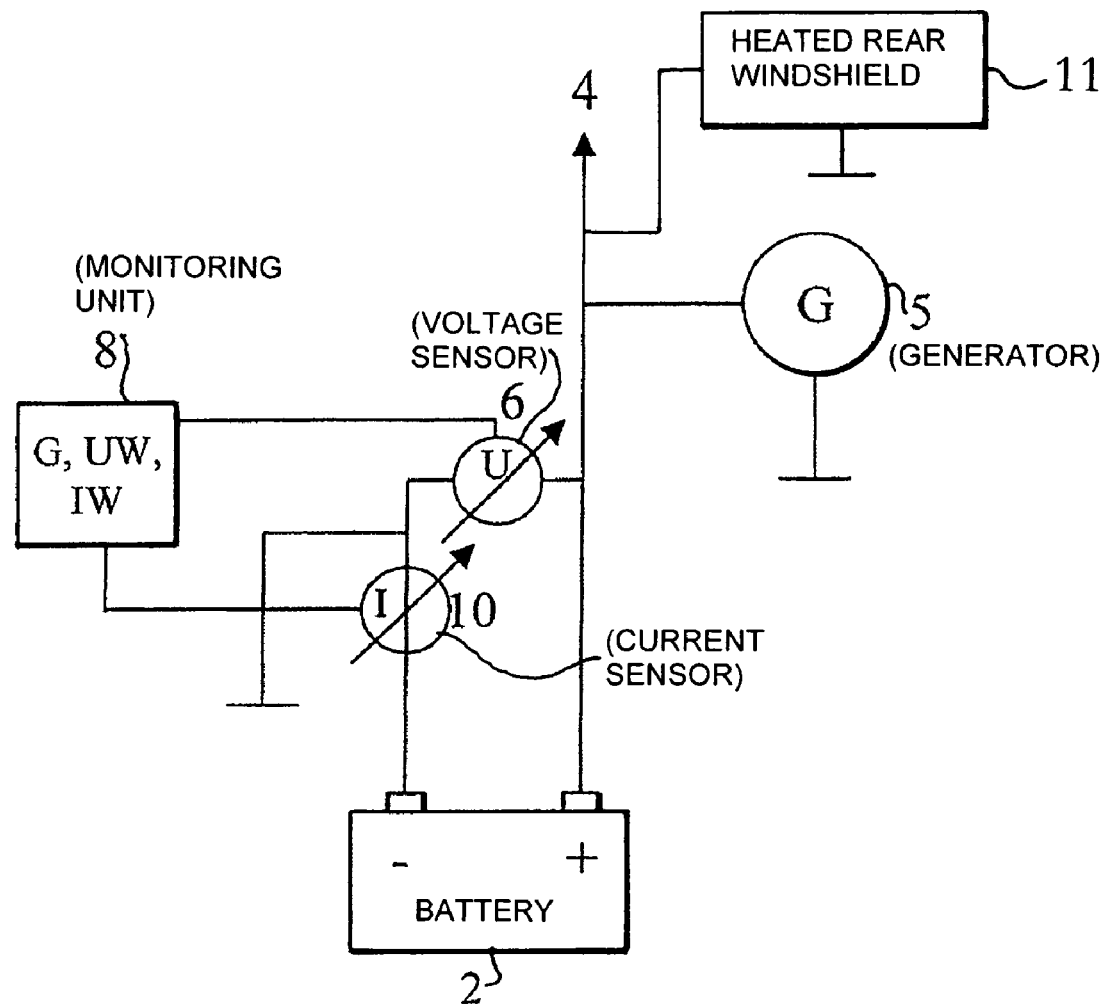
FIG. 1 shows, schematically, an arrangement for determining the buffering effect of a battery, having a sensor unit and a monitoring unit.

FIG. 1 shows an arrangement 1 for determining the buffering effect of a battery 2 for providing a voltage U for a power supply system 4, in particular for a vehicle which is not shown in any more detail. The vehicle power supply system 4 is supplied with voltage U from the battery 2. The vehicle power supply system 4 can be supplied with voltage U from the vehicle generator 5 as a second energy source. In addition, a back-up battery bat2 (not shown) can be arranged in parallel with the (vehicle power supply system) battery 2, and can be connected in order to compensate for instabilities in the vehicle power supply system and for temporary charging when required.

The arrangement 1 has a means 6 for detecting and determining, as first signal, the voltage U and/or the voltage ripple UW (referred to for short in the following text as a voltage sensor 6), and a monitoring unit 8 for monitoring the voltage U and/or the voltage ripple UW for maintenance of an extreme value $G_U$, $G_{UW}$ which can be predetermined. In addition, the arrangement 1 has a means 10 for detecting and determining, as a second signal, the current I and/or the current ripple IW (referred to for short as a current sensor 10 in the following text). The characteristic variables for the vehicle power supply system 4, such as the voltage U, the voltage ripple UW, the current I and/or the current ripple IW, are monitored by means of the monitoring unit 8 for compliance with an extreme value $G_U$, $G_{UW}$, $G_I$ or $G_{IW}$, which can be predetermined, in order to determine the buffering effect of the battery 2. The monitoring is applied to overshooting and/or undershooting of the predetermined extreme value $G_U$, $G_{UW}$, $G_I$ or $G_{IW}$, (that is, a second predetermined threshold). As the buffering effect of the battery 2 decreases, the voltage ripple UW increases, and the current ripple IW decreases. The voltage ripple UW is caused in particular by switching on loads, for example, the generator, the ignition system or a heated rear windshield 11.

Thus, the voltage ripple UW is monitored in one exemplary embodiment. When monitoring the current ripple IW, the reciprocal behavior to that of the voltage ripple is analyzed. If the respective predetermined extreme value $G_{UW}$ or $G_{IW}$ is overshot or undershot during the monitoring of the voltage ripple UW and/or of the current ripple IW, then this is an indication that the buffering effect of the battery 2 is inadequate.

Figure 2:
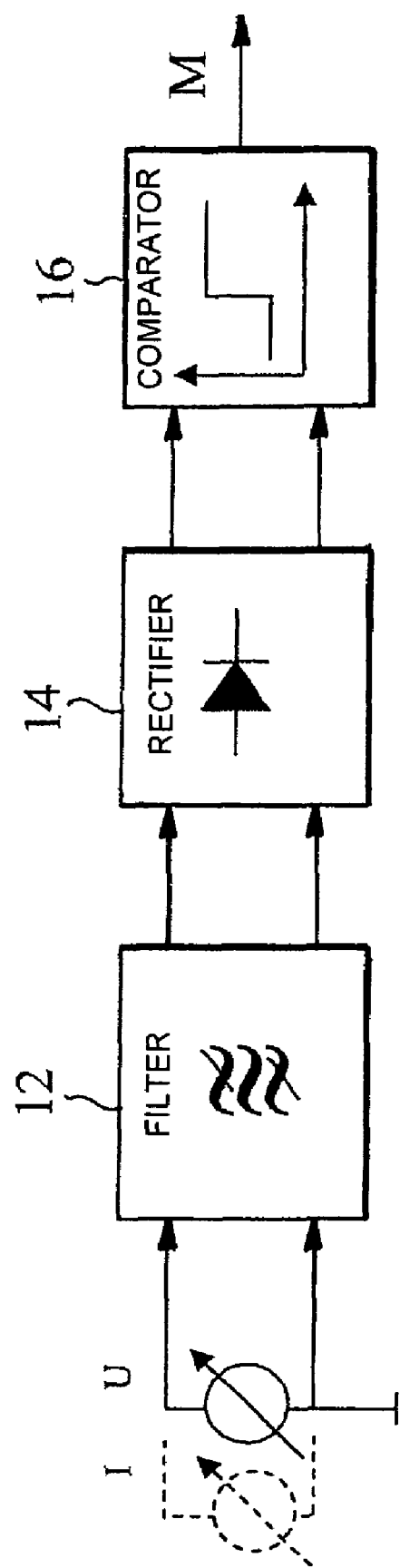
FIG. 2 shows, schematically, the sensor unit.

The monitoring unit 8 may in this case be in the form of hardware circuitry or software. By way of example, FIG. 2 shows a hardware circuitry version of the monitoring unit 8 for monitoring the voltage ripple UW for compliance with the associated extreme value $G_{UW}$. In this case, the monitoring unit 8 has a filter 12, in particular a bandpass filter. The filter 12 filters low frequency components, in particular the DC voltage, and high frequency components out of the voltage signal U. Depending on the nature and embodiment of the filter 12, this is a filter whose mid-frequency is derived from the rotational speed of the engine or of the generator 5. The filter 12 is followed by a rectifier 14 and a comparator 16. The oscillation which is filtered out of the voltage signal U by means of the filter 12 is converted by the rectifier 14 to a DC voltage, and is compared by the comparator 16 with the predetermined extreme value $G_{UW}$. In other words: the amplitude of the voltage ripple UW is monitored by means of the predetermined extreme value $G_{UW}$ for a maximum value. If the DC voltage downstream from the rectifier 14 is greater than the maximum value, then the buffering effect of the battery 2 is too low, and a predetermined operation may be performed (e.g., a warning message M is output, for example in visual form as "charge battery" or "replace battery", or audibly.

By analogy with the hardware circuitry monitoring unit 8 for the voltage ripple UW, the current ripple IW is measured by tapping off the voltage U across a shunt resistance which is connected in series with the battery 2, eg., a current-sensing voltage, which is filtered by a filter 12. The filters used for filtering the voltage and current signals may have different time constants. In this case, the amplitude of the current ripple IW is monitored for undershooting a predetermined minimum value. In addition to determining the ripples UW and/or IW, the buffering effect can also be assessed by using the response of the voltage U and current I, in particular when switching on a load, for compliance with associated extreme values $G_U$ and $G_I$. A comparator 16 based on hardware circuitry is likewise provided for this purpose.

In the exemplary embodiment according to the invention, the monitoring unit 8 may, for example, be in the form of a computer unit. The monitoring unit 8 is in this case used for monitoring and assessing the vehicle power supply system variables, that is to say the voltage U, the voltage ripple UW, the current I and/or the current ripple IW. By way of example, the computer unit is a microcontroller or some other data processor unit. In order to take account of relationships between the ripples, such as the current ripple IW and/or the voltage ripple UW, the monitoring unit 8 has families of characteristics, for example for relationships between the voltage ripple UW and the temperature, the generator DC voltage, the generator current and the battery current I. These families of characteristics are stored, for example, in the form of curves or tables.

In the preferred exemplary embodiment of the invention, in addition to the measurements of the voltage U and current I (e.g., the first and second signals) as described above, the dynamic internal resistance Ri (a third signal) of the battery 2 is determined using the monitoring unit 8, and is used to identify the buffering effect. Both the current change ΔI and the voltage change ΔU are determined in this case. The quotient of the voltage change ΔU and of the current change ΔI is used to determine the dynamic internal resistance Ri and to monitor for compliance with a predetermined associated extreme value $G_R$, in particular for a minimum value being exceeded. If the minimum value is exceeded, then the buffering effect is no longer adequate. This means that, the smaller the quotient of the voltage change ΔU and the current change ΔI, the better is the buffering effect of the battery 2. The dynamic internal resistance Ri is preferably determined when a minimum change occurs in the current I and voltage U, for example when a current change ΔI of at least 5 A and a voltage change ΔU of at least 1 V occur.

The method according to the invention for determining the buffering effect of the battery 2 will now be described in more detail in the following text.

In the method according to the invention, a new value pair for a voltage U and a current I from the battery 2 is determined cyclically, for example every 4 ms. This results in the voltage change ΔU and the current change ΔI. The monitoring device calculates filtered values from this value pair. The filter is, for example, a first-order low-pass filter. In this case, a high-speed filter is in each case preferably formed, for example with T=8 ms for the voltage U and current I. If the voltage is additionally filtered via a slow filter, for example in which T=30 ms, the voltage and current profiles can be checked for plausibility, and voltage and current flanks can be selected in advance.

These filtered voltage and current values are then searched by the monitoring device for relative minimums and maximums. The dynamic internal resistance Ri is determined after each identified extreme value, that is to say relative minimum or maximum. However, this process of determining the dynamic internal resistance Ri is carried out only subject to the following boundary conditions:

Before the identified extreme value, start values resulting from an opposite extreme value or the end of a maximum waiting time for the next extreme value will have already been stored.

The sudden changes in the battery voltage from the high-speed and slow filters have the same mathematical sign. Sudden changes such as the falling flanks of a load dump or load shedding, when the current decreases sharply, but the voltage does not change to the same extent, are thus ignored.

The dynamic change to the battery voltage must have a specific minimum magnitude. In the case of very large sudden voltage changes and sudden changes which are completely in the discharge area, it is sufficient to check that the slow voltage change is not greater than the rapid change.

In the case of sudden changes in which the current starts or ends in the discharge area, the high-speed sudden voltage change must be 15–30% greater than the slow sudden voltage change.

Sudden changes which are completely in the charging area must have the greatest dynamic response. The high-speed voltage change must be 25–50% greater than the slow voltage change.

When the generator is running, this can be identified from the fact that the sudden voltage change from the high-speed filter must be greater by a specific factor than that of the slow filter (for example 25%). For very large sudden voltage changes (>2 V) or when the generator is inactive, it is sufficient to check that the difference from the high-speed filter is at least not less than that from the slow filter.

The mathematical sign of the sudden voltage change and sudden current change must be the same (dU*dI>0), or the current must be below the tolerance limit.

If these boundary conditions are satisfied, the dynamic internal resistance Ri is calculated.

Before calculating the dynamic internal resistance Ri, a check is carried out to ensure that no division by zero is being carried out or that a negative value has been determined for Ri. If the magnitude of the current is below the tolerance limit, the mathematical sign of the voltage and a minimum value are transferred.

The significance of the identified flank is determined on the basis of the measurement error to be expected.

Based on the formula:

$$Ri = \frac{dU \pm 2 \times fU}{dI \pm 2 \times fI}$$

and taking account of the maximum resistance (measured voltage high, measured current small):

$$\text{significance} = \text{abs}\left(\frac{1}{1 - \frac{dU \times dI + 2 \times fU \times dI}{dU \times dI - 2 \times fI \times dU}}\right)$$

where fU and fI are the errors to be expected from the voltage and current measurements respectively (for example noise, quantization error from the A/D converter, ... ).

The significance is thus derived from the relative error in the resistance determination (relative error=0 . . . 1).

The limit value analysis results for very large sudden voltage and current changes with a significance which tends to infinity. For values for which the sudden voltage change is large and sudden current change is small, or for which the sudden voltage change is small and sudden current change is large, the resultant significance is small, and tends to 0.

The significance, divided by 100 and limited to unity, results in the weighting. The dynamic internal resistance Ri, which is obtained from the quotient of the voltage change ΔU and current change ΔI, is weighted by means of this weighting factor.

A measured value with an expected error of less than 1% would thus be transferred immediately.

The rest of the calculation process takes account only of those values of the dynamic internal resistance Ri for which one of the following conditions is satisfied:

The weighting indicates a sufficiently small measurement error.

The sudden voltage change is very large.

The sudden current change is very large.

The alternative calculation with a large sudden voltage change or sudden current change means that it is also possible to calculate very small or large resistance values (but with a high error probability).

The new, filtered value of the dynamic internal resistance Ri is obtained from the old values and from the correspondingly weighted new value, using the formula:

RiFilt=RiFilt×(1−weighting flank)+Riflank×weighting flank

In the initial phase, the sum of all the previous weighting processes carried out is less than unity. In this situation, the weighting for the current flank is related to the sum of the existing weightings, and this relative value is used as the present flank weighting. The smaller the sum of the existing weightings and the higher the weighting for the present flank, the greater the extent to which this present flank is thus taken into account.

In addition to the normal calculation, a "high-speed dynamic internal resistance Ri-fast" is also calculated. This is composed of only the last 20 calculated values and thus has a considerably faster dynamic response, and is less accurate, than the filtered dynamic internal resistance Ri. In the event of major discrepancies between the filtered dynamic internal resistance Ri and the high-speed dynamic internal resistance Ri-fast, the high-speed dynamic internal resistance Ri-fast is used, provided that it is sufficiently stable and that one of the values (filtered or high-speed) is above a specific minimum value. If no values of the dynamic internal resistance Ri are determined for a very long time, the high-speed dynamic internal resistance Ri-fast is reset, in order to produce values more quickly when stimulated once again.

The validity is assessed in measuring the time which is required to calculate the high-speed dynamic internal resistance Ri-fast. If a predetermined time interval has passed here, the validity may be assumed to be no longer adequate.

A statement about the buffering effect of the battery 2 can be made from the validity and from the determined dynamic internal resistance Ri.

There are two output variables for the statement about the buffering effect of the battery 2:

1. A first output signal A1, which always produces a value, even when the stimulus is no longer sufficient. This value is required in order to ensure that a statement is always produced about the buffering effect of the battery 2. If the stimulus is no longer sufficient, this output signal remains at the last determined value. New values are not determined again until the validity is sufficient.

2. A second output signal A2, which produces a value only when the validity is sufficient. If this is no longer the case, the output signal produces the value for "not available".

The statement about the buffering effect of the battery is updated whenever a new dynamic internal resistance Ri has been determined and the validity is sufficient.

The output variable is formed in two stages. Firstly, three areas are assessed independently of one another. The areas are then checked, and the output variables are formed.

There are a number of critical areas in which the dynamic internal resistance Ri may move. These are assessed independently of one another on the same principle, with different parameters (thresholds and times). Each area has an associated upper and lower threshold as well as a minimum time for overshooting of the upper threshold and a minimum time for undershooting of the lower threshold. In consequence, for very low values (<20 mΩ), the dynamic internal resistance is calculated less accurately than, for example, at 80 mΩ. Furthermore, the critical battery state must be identified more quickly than, for example, during external starting.

An upper threshold value Tho and a lower threshold value Thu are defined as thresholds (first predetermined threshold) for the dynamic internal resistance. In addition, two time intervals To and Tu, respectively are defined, during which the thresholds must be exceeded by the dynamic internal resistance Ri before the state for the corresponding area changes. The time intervals may be set differently from each other, based on a state of a vehicle power supply system, an additional measurement of the dynamic internal resistance, or an external start.

When a valid value for the dynamic internal resistance Ri is determined for the first time after resetting, a value is in each case assumed for the buffering effect. This is Ri-lower if the value is below the upper threshold value, otherwise it is Ri-higher. This procedure was chosen since, otherwise, no statement could be made for a relatively long time when the determined dynamic internal resistance Ri is between the two threshold values, and the battery state is normally improving. Furthermore, no message is produced in the better case.

A change in the corresponding range variable then occurs only when:

The dynamic internal resistance Ri is below Thu for longer than Tu when the state is poor; the buffering effect is then set to Ri-lower.

The dynamic internal resistance Ri is above Tho for longer than To when the state is good; the buffering effect is then set to Ri-higher.

Various thresholds and times are stated as the value range owing to the various battery sizes and technologies that are to be used, and these are used to form individual range bits, as is shown in Table 1, so that it is possible to distinguish between a threshold for a critical vehicle power supply system state, a threshold for the initiation of additional measures, for example connection of a second battery (back-up battery) bat 2, and a threshold for external starting fs.

TABLE 1

| | Tho [mΩ] | Thu [mΩ] | To [s] | Tu [s] | Comments |
|---|---|---|---|---|---|
| Ri-crit | 220–130 | 140–90 | 0.5–3 | 0.3–3 | Threshold for critical vehicle power supply system state |
| Ri-bat2 | 90–20 | 50–15 | 3–20 | 3–20 | Threshold for initiating additional measures, for example connection of a second battery |
| Ri-fs | 30–15 | 20–8 | 10–40 | 10–40 | Threshold for external starting |

Once the individual range bits have been formed, these are used together with the information about the validity in order to form the output variables A1 and A2.

The logic linking of these range bits is shown in Table 2 below:

TABLE 2

| Ri-crit | Ri-bat2 | Ri-fs | Validity OK | A1 | A2 |
|---|---|---|---|---|---|
| 0 | 0 | 0 | 0 | A1-io | A2-nv |
| 0 | 0 | 0 | 1 | A1-io | A2-io |
| 0 | 0 | 1 | 0 | A1-fs | A2-nv |
| 0 | 0 | 1 | 1 | A1-fs | A2-io |
| 0 | 1 | 0 | 0 | A1-bat2 | A2-nv |
| 0 | 1 | 0 | 1 | A1-bat2 | A2-bat2 |
| 0 | 1 | 1 | 0 | A1-bat2 | A2-nv |
| 0 | 1 | 1 | 1 | A1-bat2 | A2-bat2 |
| 1 | 0 | 0 | 0 | A1-crit | A2-nv |
| 1 | 0 | 0 | 1 | A1-crit | A2-crit |
| 1 | 0 | 1 | 0 | A1-crit | A2-nv |
| 1 | 0 | 1 | 1 | A1-crit | A2-crit |
| 1 | 1 | 0 | 0 | A1-crit | A2-nv |
| 1 | 1 | 0 | 1 | A1-crit | A2-crit |
| 1 | 1 | 1 | 0 | A1-crit | A2-nv |
| 1 | 1 | 1 | 1 | A1-crit | A2-crit | where A1-io is equivalent to the buffering effect being satisfactory, A1-fs is equivalent to the buffering effect in the external starting range, A1-bat2 is equivalent to the buffering effect in the range in which the second battery should be connected, A1-crit is equivalent to a critical buffering effect, A2-io is equivalent to a satisfactory buffering effect, A2-fs is equivalent to a buffering effect in the external starting range, A2-bat2 is equivalent to a buffering effect in the range in which the second battery should be connected, A2-crit is equivalent to a critical buffering effect, and A2-nv is equivalent to a value for the buffering effect not being available.

In order to provide sufficient stimulus for the process in phases in which a valid determination of the dynamic internal resistance Ri is required, one preferred development of the invention provides for the heated rear windshield to be used, if required, in order to produce additional flanks. This is done by deliberately operating the heated rear windshield, although the following boundary conditions must be satisfied in this case, to ensure that a stimulus is provided by the heated rear windshield:

The instantaneously determined value of the dynamic internal resistance Ri must be greater than a specific value.
The generator must be active.
The instantaneous stimulus is not sufficient.
A minimum time Tmin must have passed since the end of the last stimulation pulse.

If these boundary conditions are satisfied, a drive device in the monitoring device first of all deactivates the heated rear windshield if it is being operated. Once a delay time THSS off has elapsed, the heated rear windshield is activated (again). A second delay time THSS on is then allowed to pass, after which the heated rear windshield is returned to normal control by the drive device.

This means that the dynamic internal resistance Ri can be determined reliably and easily even in a situation in which the normal stimulus is missing, so that a statement can be made without any problems about the buffering effect of the battery 2.

Figure 3:
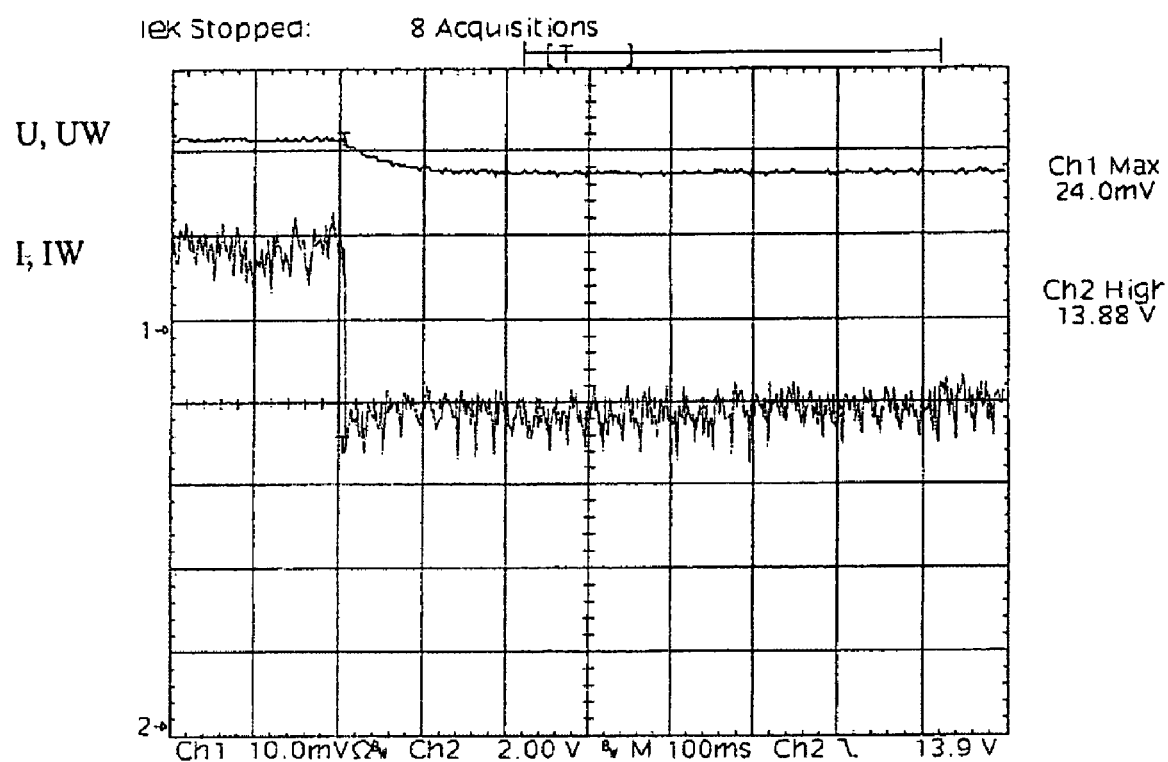
FIGS. 3 to 4 show diagrams of a current/voltage characteristic for a battery.

The following text describes various measurements on the battery 2 with reference to diagrams, and explains their effects on the buffering effect of the battery 2 in more detail. By way of example, FIG. 3 shows a diagram of a current/voltage characteristic of a charged battery 2. The upper curve shows the voltage U, and the lower curve shows the current I from the battery 2. The voltage ripple UW is very small despite the pulsed current change ΔI. The battery 2 thus has a largely good buffering effect. In this case, as described above, the voltage ripple UW is monitored by the arrangement 1 for compliance with the predetermined limit value $G_{UW}$.

Figure 4:
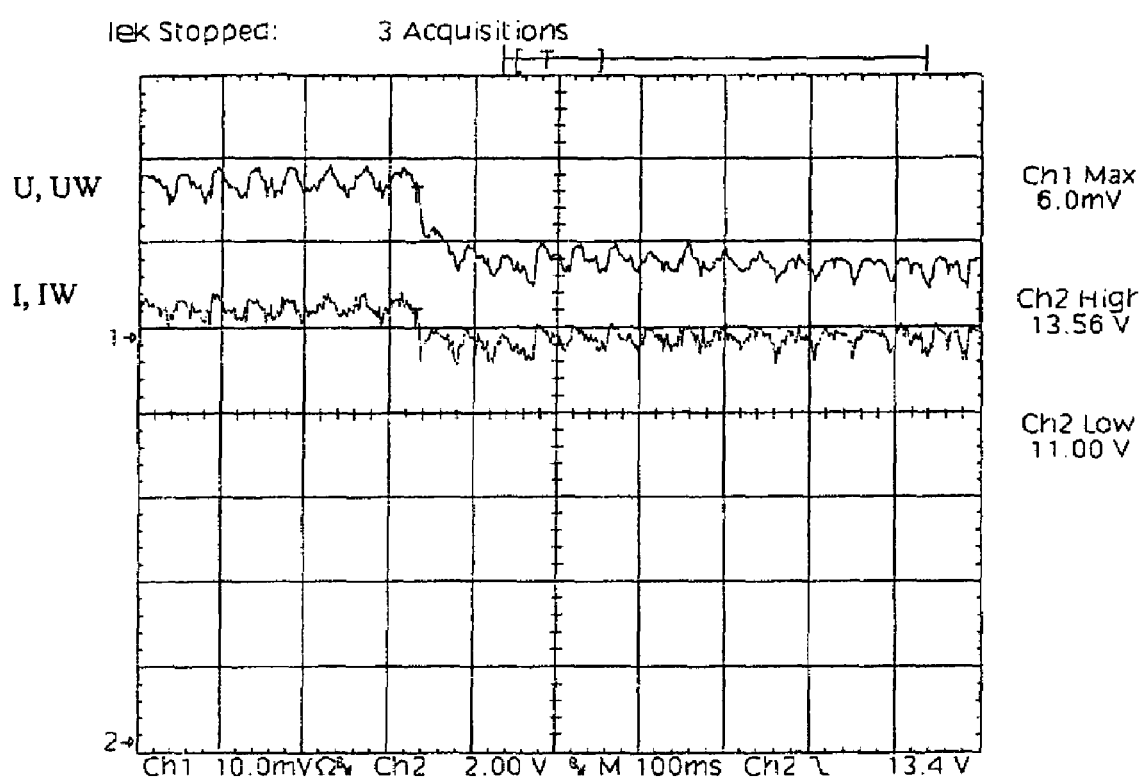

By way of example, FIG. 4 shows a current/voltage characteristic for a measurement with a battery 2 which has been discharged to a major extent, and no longer has any buffering effect. The voltage ripple UW (upper curve) is considerably greater than that of the measurement in FIG. 3, and this is thus an indication that a buffering effect of the battery 2 is insufficient.

In addition to determination and detection as well as monitoring of the voltage ripple UW and/or of the current ripple IW, the behavior of the vehicle power supply system voltage U and of the vehicle power supply system current I, particularly when a load is connected, can also be used to assess the buffering effect of the battery 2, as already explained above.

Figure 5A:
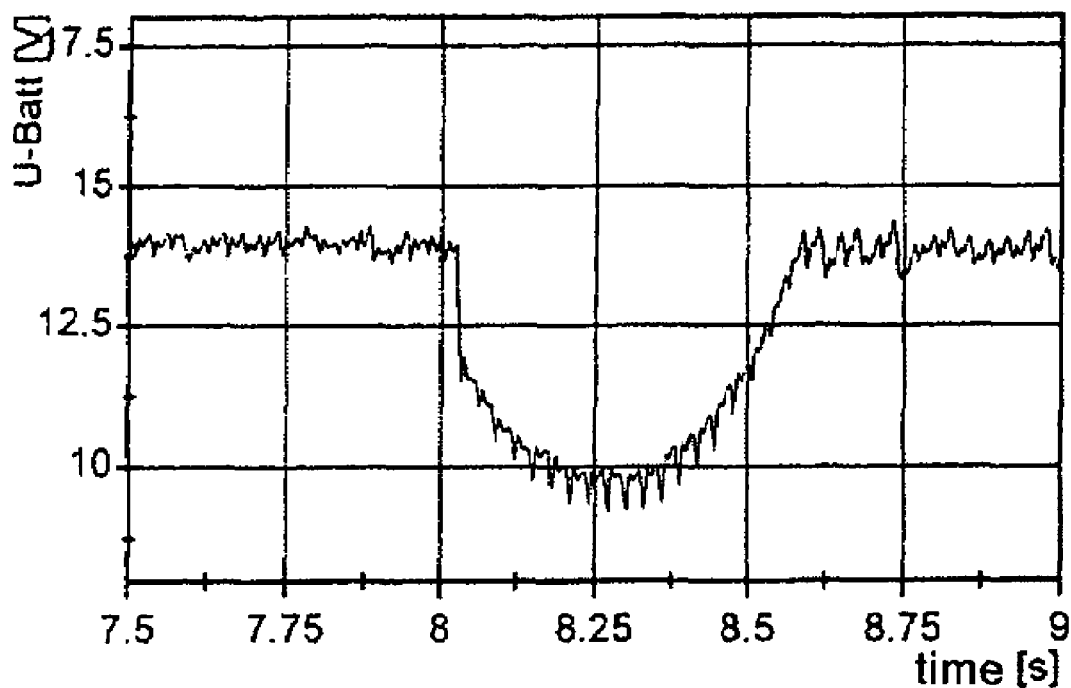
Figure 5B:
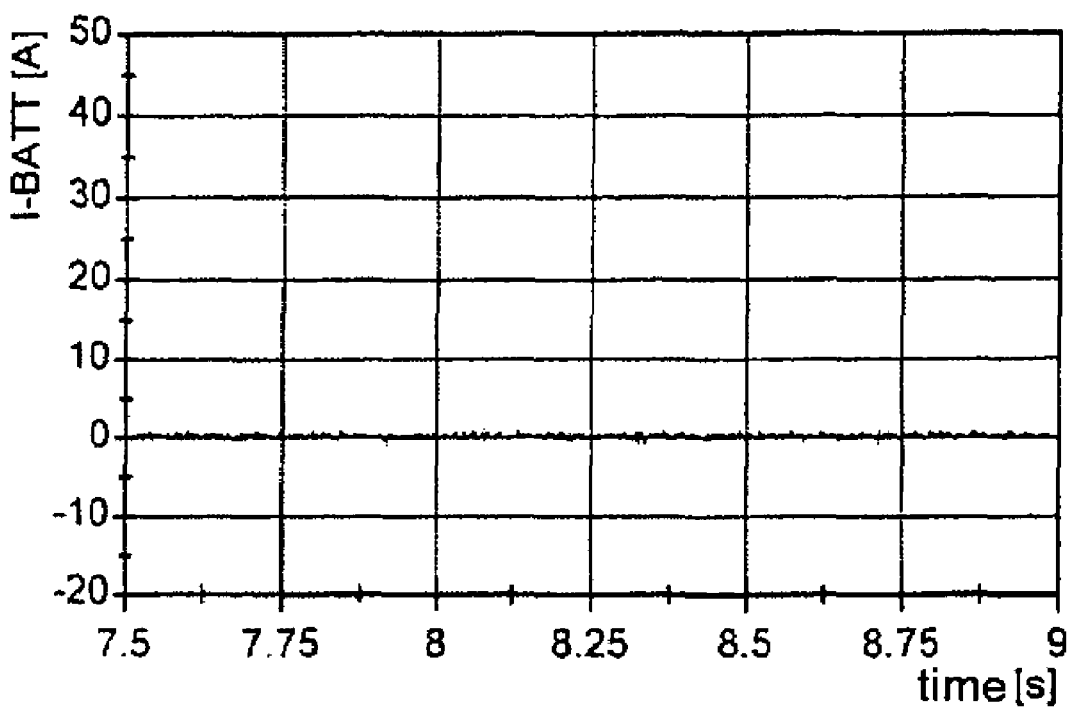

FIGS. 5A and 5B show the voltage profile (top) and the current profile (bottom) while a load is switched on, for example the rear windshield heating. The measurement was carried out without any battery 2, that is to say there was no buffering effect from the battery 2. Since there is no battery 2, no battery current I flows either, and all the current I must be provided from a generator 5. The sudden rise in the current I in the vehicle power supply system 4 first of all results in the voltage U collapsing, although a regulator within the generator regulates the voltage U to its nominal value once again within about 600 ms.

The fact that the load has been switched on, in this case the rear windshield heating, is in this case determined by means of the voltage sensor 6 and the current sensor 10 or, alternatively, by means of a signal via a databus. Once the load has been switched on, the voltage dip as determined by the voltage sensor 6 and the current sensor 10, and the current profile are assessed by means of the monitoring unit 8, which is in the form of hardware circuitry and/or software. The current profile shows when the load is switched on, and the buffering effect is deduced from the associated voltage profile. If the voltage U falls below a predetermined limit value $G_U$, for example of 12.5 V, then this indicates that the buffering effect of the battery 2 is no longer sufficient.

The current change ΔI can also be used to estimate the current drawn by the load. If the current change ΔI is considerably less than the rated current of the load, then the battery 2 can no longer supply sufficient current I. In this case, the detection of the voltage U and of the current I is carried out continuously, in particular immediately after the load is switched on, and within the regulation time of the generator 5. For test purposes, the load can be switched on and off two or more times in order to ensure that the measurement does not have any other load, switched on on a random basis, superimposed on it, with the measurement providing incorrect statements.

As already explained in more detail above, the voltage change ΔU and the current change ΔI can be used to determine the dynamic internal resistance. As already stated above, the quotient ΔU/ΔI is determined following a significant current or voltage change, for example of ΔU=1V or of ΔI=5A, in the vehicle power supply system 4. In this case, the monitoring unit 8 monitors the quotient of the voltage change ΔU and the current change ΔI for a predetermined limit value $G_R$. The smaller the quotient of ΔU/ΔI, the better is the buffering effect of the battery 2. The monitoring therefore looks for the limit value $G_R$, in particular a minimum value, being exceeded.

Figure 6A:
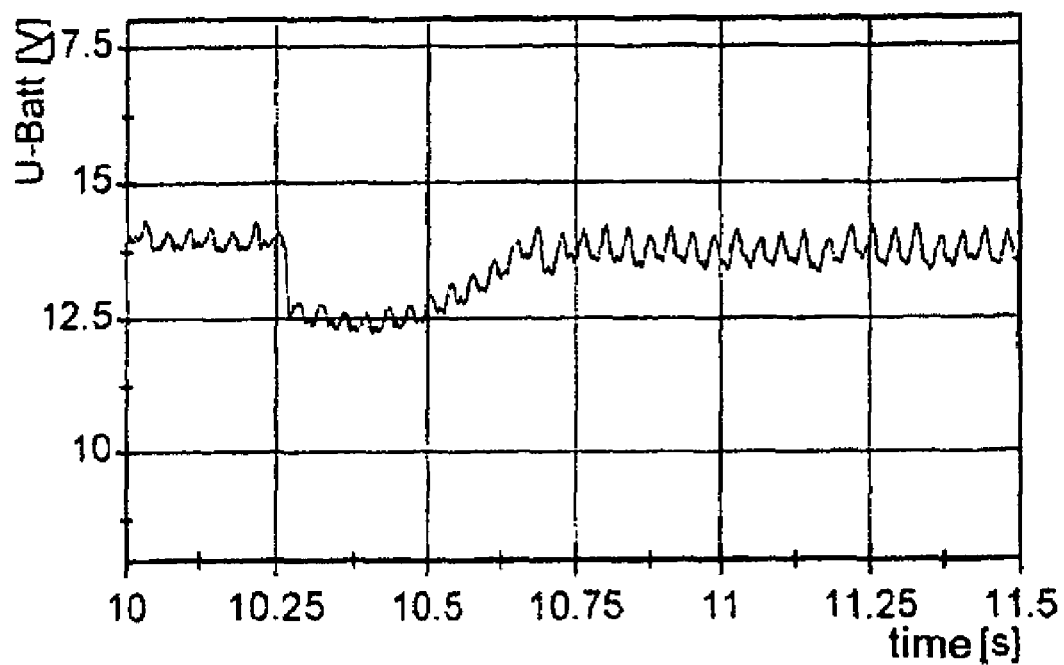
Figure 6B:
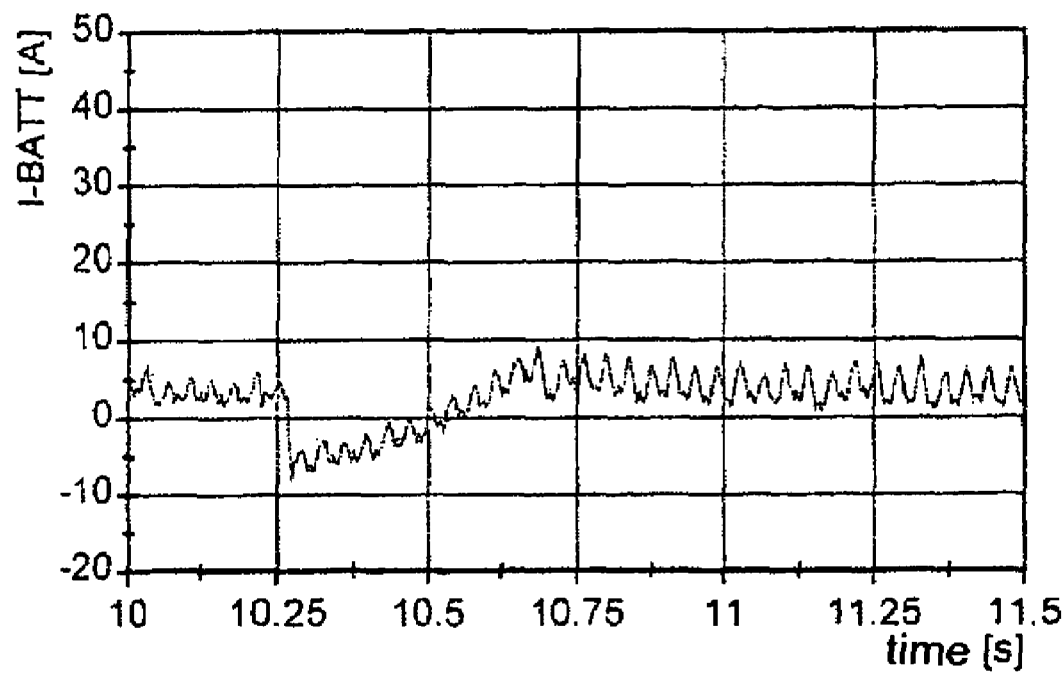

FIGS. 6A and 6B show the same measurement as that shown in FIGS. 5A and 5B, but with a defective battery 2, that is to say a battery 2 with only a limited buffering capability. The battery 2 is first of all charged until the time t=10.25 s, after which the rear windshield heating is switched on, and the current I then becomes negative. In this case, the battery 2 does not supply all of the current I that is required to operate the rear windshield heating. The sudden change in the battery current I after the rear windshield heating or the load is switched on is less than the actual current (rated current) of the rear windshield heating. In consequence, the voltage U from the generator 5 largely collapses, that is to say down to U=12.5 volts. The generator 5 once again regulates the voltage U with an appropriate time constant. In this case, the monitoring unit 8 can use the high voltage ripple UW or the reduced sudden current change and the major dip in the voltage as a criterion that the battery 2 has a poor buffering effect.

Figure 7A:
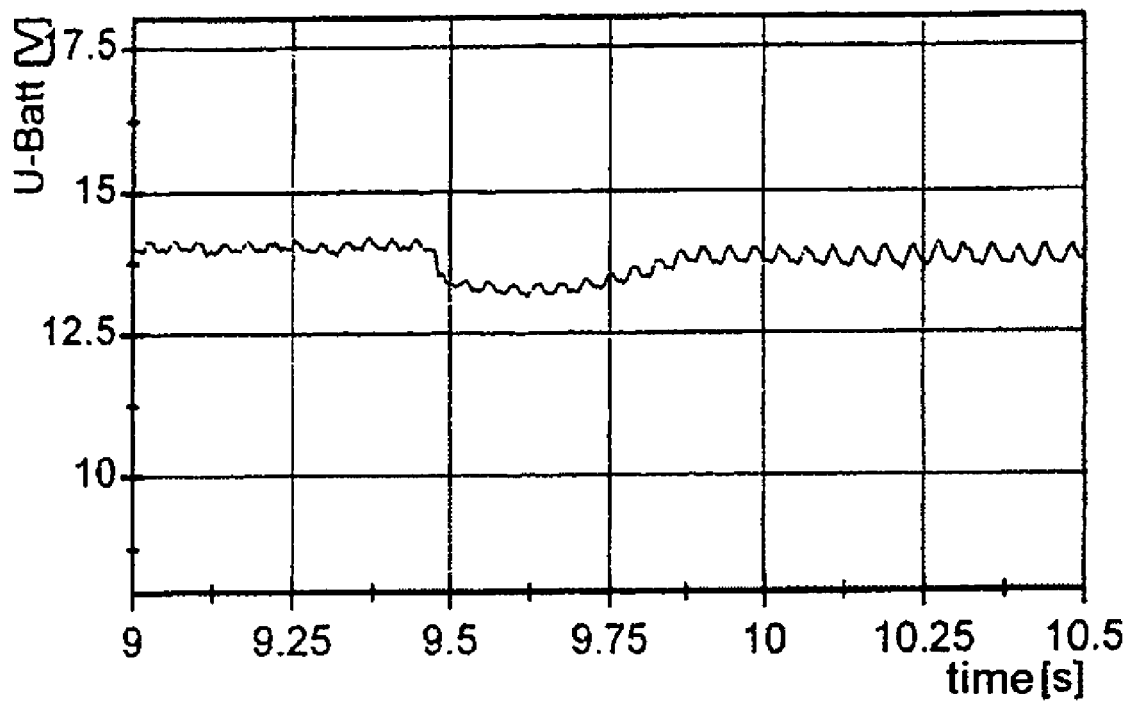
Figure 7B:
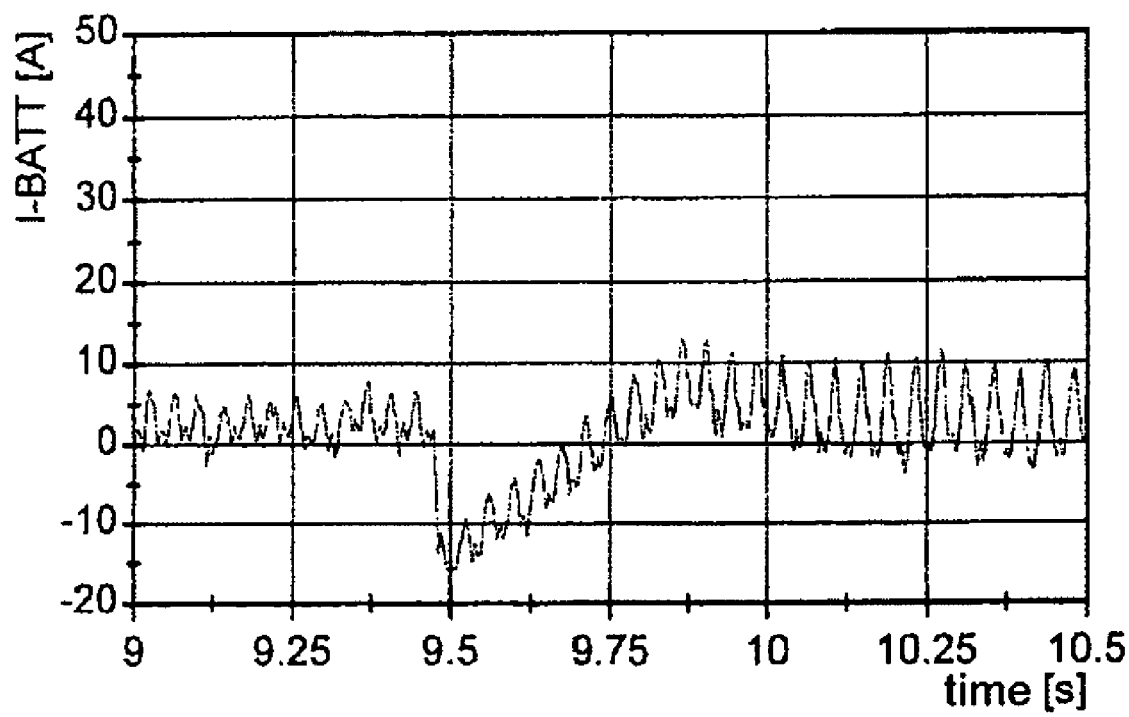

FIGS. 7A and 7B show the current/voltage characteristic for the same measurement as that shown in FIGS. 6A and 6B, but with a battery 2 having a better buffering capability than that battery. First of all, the battery 2 is charged until a time t=9.5 S, after which the rear windshield heating is switched on and the current I becomes negative. In this case, more current I is drawn from the battery 2 for operation of the rear windshield heating than in the case shown in FIG. 6B. The voltage U from the generator 5 thus dips to a lesser extent, that is to say down to U=13.25 volts. The generator 5 once again regulates the voltage with the corresponding time constant. In this case as well, the monitoring unit 8 can use the high degree of voltage ripple UW or the reduced sudden current change and the major drop in voltage as a criterion for a poor buffering effect.

Figure 8A:
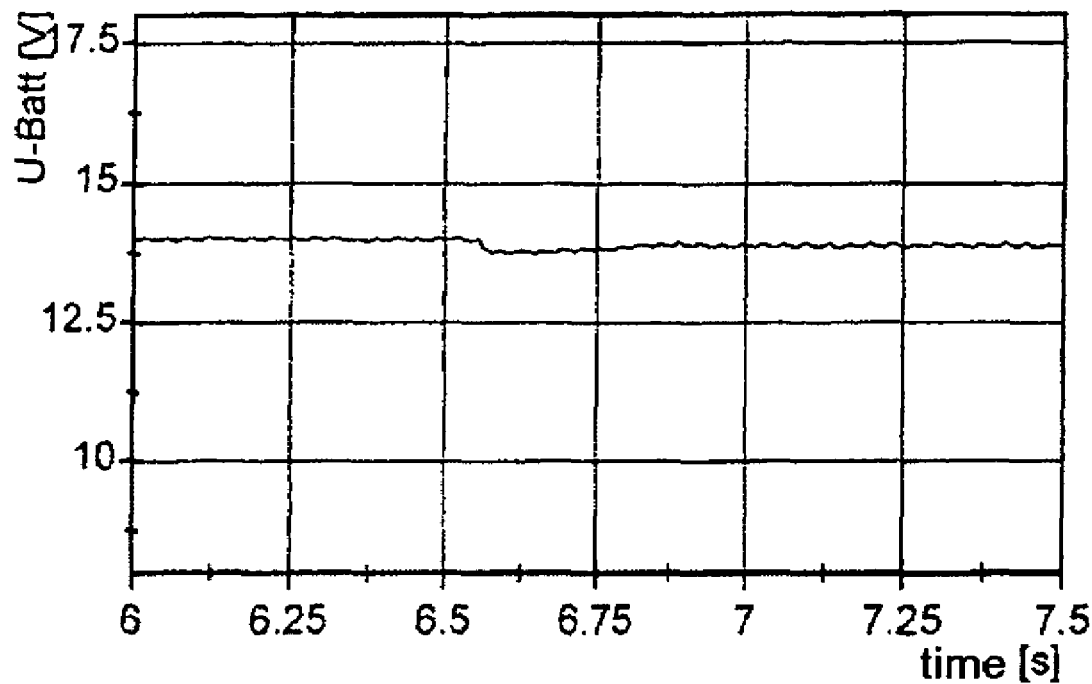
Figure 8B:
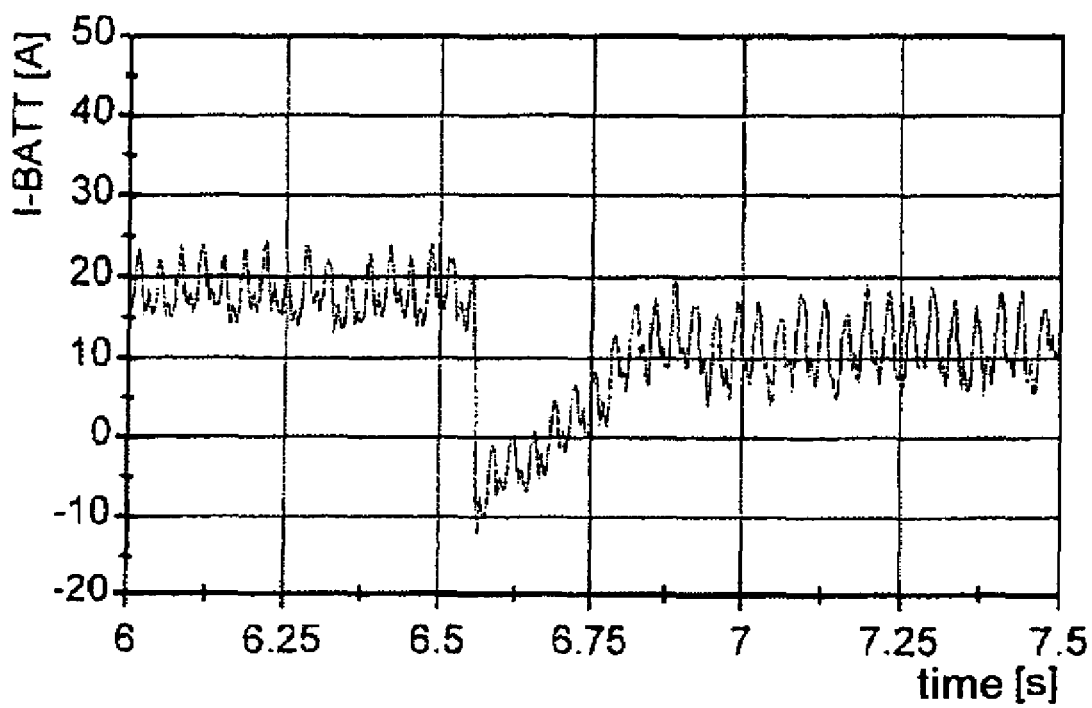

In contrast, FIGS. 8A and 8B show the current/voltage characteristic for the same measurement with a battery 2 with a full buffering capability. This clearly shows that the voltage ripple UW is considerably less than that of FIGS. 5A, 5B to 7A, 7B. The battery 2 is first of all charged until a time t=6.6 s, after which the rear windshield heating is switched on. The current I becomes negative, and virtually all of the current I for the rear windshield heating can be drawn from the battery 2. In consequence, the voltage U from the generator dips by only about 150–200 mV. The monitoring unit 8 uses the reduced voltage ripple UW to determine that the battery 2 has a largely good buffering effect.

Figures 10A, 10B, 10C:
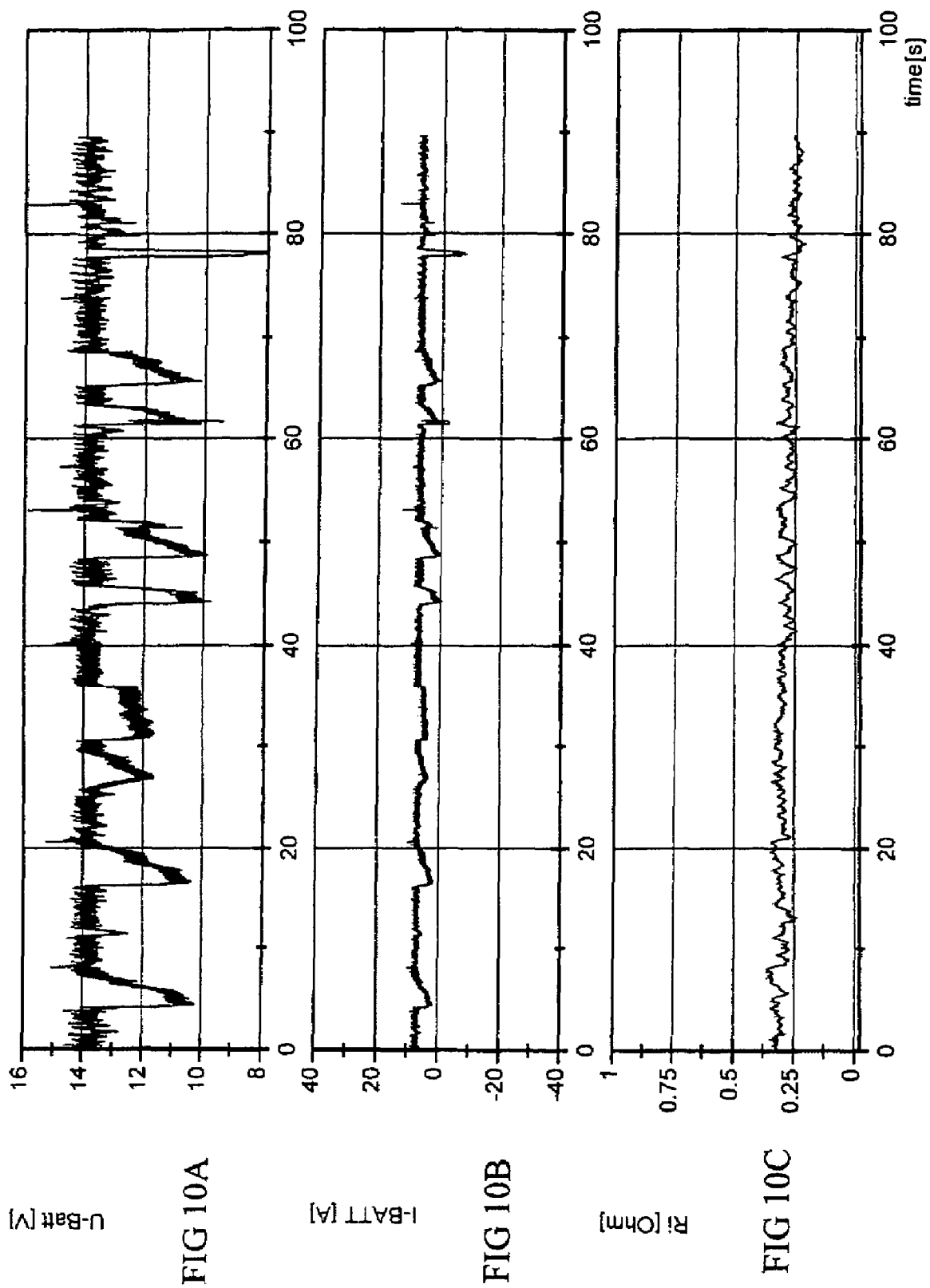

FIGS. 9A–9C to 11A–11C show the current/voltage characteristic as well as the characteristic for the dynamic internal resistance Ri of a battery 2 which has been deep-discharged and which has been thawed out. In FIGS. 9A to 9C, the battery 2 is still severely frozen and is not absorbing any charge, that is to say the current I=0. In this state, the monitoring unit 8 monitors in particular the dynamic internal resistance Ri, which is very high, with Ri being greater than 1 Ω. The battery 2 therefore has no buffering effect. FIGS. 10A to 10C show the characteristics for the same battery 2 about 18.6 h after it has thawed out. In this case, the battery 2 is drawing current I. The dynamic internal resistance Ri has fallen to a value of between 250 and 350 mΩ. By monitoring the dynamic internal resistance Ri, the monitoring unit 8 thus identifies a buffering effect, since the dynamic internal resistance Ri has fallen below the associated limit value $G_R$. Once the battery has been charged for a period of 7 minutes, the dynamic internal resistance Ri falls to a value below 250 mΩ. The associated characteristics are shown in FIGS. 11A to 11C.

FIGS. 11A to 11C show the current/voltage characteristic and the characteristic for the dynamic internal resistance Ri for a fully charged battery 2 with a maximum buffering effect. The dynamic internal resistance Ri has fallen to a value of 10 to 20 mΩ.

Depending on the nature and the configuration of the arrangement 1, the voltage ripple UW or the voltage drop can be monitored separately or in a combined manner in order to determine the buffering effect of the battery 2. Furthermore, any other desired combinations of the monitoring of the current ripple IW, of the decreasing current I, of the voltage drop U and/or of the dynamic internal resistance Ri can be monitored for compliance with limit values G.

In summary, in order to identify the serviceability of a battery in as simple and reliable a manner as possible, the present invention discloses a method for determining the buffering effect of the battery (2) for providing a voltage (U) for a power supply system (4), in particular for a vehicle, in which a voltage change and a current change are detected cyclically, the dynamic internal resistance of the battery is determined on the basis of the quotient of the voltage change and of the current change, the determined dynamic internal resistance is monitored for exceeding a limit value which can be predetermined, and a statement is made about the buffering effect of the battery, and is output. In this case, the buffering effect of the battery is better the smaller the quotient of the voltage change and current change.

The invention claimed is:

1. A method to determine a buffering effect of a battery, comprising:
   cyclically determining a voltage change and a current change generated by said battery;
   determining a dynamic internal resistance of said battery based on a quotient of said voltage change and said current change;
   determining whether said dynamic internal resistance exceeds a predetermined value;
   performing a predetermined operation if said dynamic internal resistance exceeds said predetermined value;
   filtering said voltage change and said current change; and
   determining said dynamic internal resistance based on minimum or maximum values of said filtered voltage change and said filtered current change.

2. The method of claim 1, wherein filtering said voltage change and said current change comprises processing said current change and/or voltage change by two or more parallel filters having respectively different time constants, wherein respective outputs of said parallel filters are used to enable said determination of said dynamic internal resistance.

3. The method of claim 1, wherein enabling said determination of said dynamic internal resistance using said respective outputs of said parallel filters depends on a status of a vehicle power supply system.

4. The method of claim 1, further comprising generating a weighting factor for said dynamic internal resistance based on a relative error of determining said dynamic internal resistance.

5. The method of claim 4, further comprising determining said dynamic internal resistance based on previous measurements of said dynamic internal resistance modified by corresponding weighting factors.

6. The method of claim 5, wherein at most the previous 20 measurements of said dynamic internal resistance is used to determine said dynamic internal resistance.

7. The method of claim 5, wherein performing said predetermined operation is conducted whenever a new dynamic internal resistance has been determined.

8. The method of claim 1, further comprising:
defining an upper threshold and a lower threshold for said dynamic internal resistance; and
defining a first time interval and a second time interval during which said dynamic internal resistance must respectively overshoot or undershoot to perform said predetermined operation.

9. The method of claim 8, further comprising setting said upper and lower threshold values and said time intervals differently based on a state of a vehicle power supply system, an additional measurement of said dynamic internal resistance, or an external start.

10. The method of claim 1, further comprising driving a load to said battery to make a valid determination of said dynamic internal resistance.

11. The method of claim 10, wherein said load comprises a heated rear windshield.

* * * * *